(12) United States Patent
Crisp et al.

(10) Patent No.: US 11,570,926 B2
(45) Date of Patent: Jan. 31, 2023

(54) MAGNETIC DUAL AXIS HINGE SYSTEM AND METHOD THEREFOR

(71) Applicant: DELL PRODUCTS, LP, Round Rock, TX (US)

(72) Inventors: Richard A. Crisp, Austin, TX (US); Bernard D. Strmiska, Round Rock, TX (US); Brad Philip Collins, Austin, TX (US); Peter Kaltenbach, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 88 days.

(21) Appl. No.: 17/097,525

(22) Filed: Nov. 13, 2020

(65) Prior Publication Data

US 2022/0159861 A1 May 19, 2022

(51) Int. Cl.
*H05K 7/00* (2006.01)
*H05K 7/14* (2006.01)
(Continued)

(52) U.S. Cl.
CPC ........... *H05K 7/1488* (2013.01); *E05C 9/042* (2013.01); *H05K 5/023* (2013.01); *H05K 5/0221* (2013.01);
(Continued)

(58) Field of Classification Search
CPC .... H05K 7/1488; H05K 5/0221; H05K 5/023; E05C 9/042; E05C 9/04; E05C 9/043; E05C 9/10; E05C 9/14; E05C 9/16; E05C 19/16; E05C 19/161; E05C 19/163; E05Y 2201/638; E05Y 2201/686; E05Y 2900/20; E05B 15/0073; E05B 47/0038; E05B 47/004; E05B 47/0046; Y10T 292/08; Y10T 292/0801; Y10T 292/0834; Y10T 292/0838; Y10T 292/0844; Y10T 292/0845; Y10T 292/11; Y10T 292/688; Y10T 292/691
(Continued)

(56) References Cited

U.S. PATENT DOCUMENTS 8,132,874 B2   3/2012  Ong et al.
8,678,524 B2   3/2014  Green
(Continued)

FOREIGN PATENT DOCUMENTS

CN   1207488    *  2/1999
CN   108400528   *  8/2018
(Continued)

*Primary Examiner* — Janet M Wilkens
(74) *Attorney, Agent, or Firm* — Larson Newman, LLP (57) ABSTRACT

A latch to secure an access panel at an enclosure may include a shuttle component including a latch pin. The latch pin is configured to engage with a corresponding receptacle at the enclosure. A spring retracts the latch pin to within the access panel when the access panel is not positioned for installation at the enclosure, and permits the latch pin to protrude from the access panel to mate with the receptacle in response to magnetic attraction by a magnet positioned within the receptacle when the access panel is positioned for installation at the enclosure. The magnetic attraction of the magnet to the latch pin overcomes the force of the spring to retract the latch pin.

15 Claims, 7 Drawing Sheets

(51) Int. Cl.
*E05C 9/04* (2006.01)
*H05K 5/02* (2006.01)

(52) U.S. Cl.
CPC ... *E05Y 2201/638* (2013.01); *E05Y 2201/686* (2013.01); *E05Y 2900/20* (2013.01)

(58) Field of Classification Search
USPC ............. 312/223.2, 326, 329, 215–218, 324, 312/223.1, 265.1–265.4
See application file for complete search history.

(56) References Cited

U.S. PATENT DOCUMENTS

2009/0139145 A1\* 6/2009 Watanabe ............. E05D 15/502
49/193
2015/0206644 A1\* 7/2015 Gerovac ................ H01F 27/02
312/223.1
2015/0330126 A1\* 11/2015 Ma ........................ E05C 19/163
292/32

FOREIGN PATENT DOCUMENTS

| CN | 110094913 | \* | 8/2019 |
| CN | 110847715 | \* | 2/2020 |
| CN | 111770653 | \* | 10/2020 |
| CN | 212507971 | \* | 2/2021 |
| KR | 100837009 | \* | 6/2008 |
| WO | 2011144708 | \* | 11/2011 |
| WO | 2014094071 | \* | 6/2014 |

\* cited by examiner

MAGNETIC DUAL AXIS HINGE SYSTEM AND METHOD THEREFOR

FIELD OF THE DISCLOSURE

This disclosure generally relates to information handling systems, and more particularly relates to a magnetic dual axis hinge system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A latch to secure an access panel at an enclosure may include a shuttle component including a latch pin. The latch pin is configured to engage with a corresponding receptacle at the enclosure. A spring retracts the latch pin to within the access panel when the access panel is not positioned for installation at the enclosure, and permits the latch pin to protrude from the access panel to mate with the receptacle in response to magnetic attraction by a magnet positioned within the receptacle when the access panel is positioned for installation at the enclosure. The magnetic attraction of the magnet to the latch pin overcomes the force of the spring to retract the latch pin.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
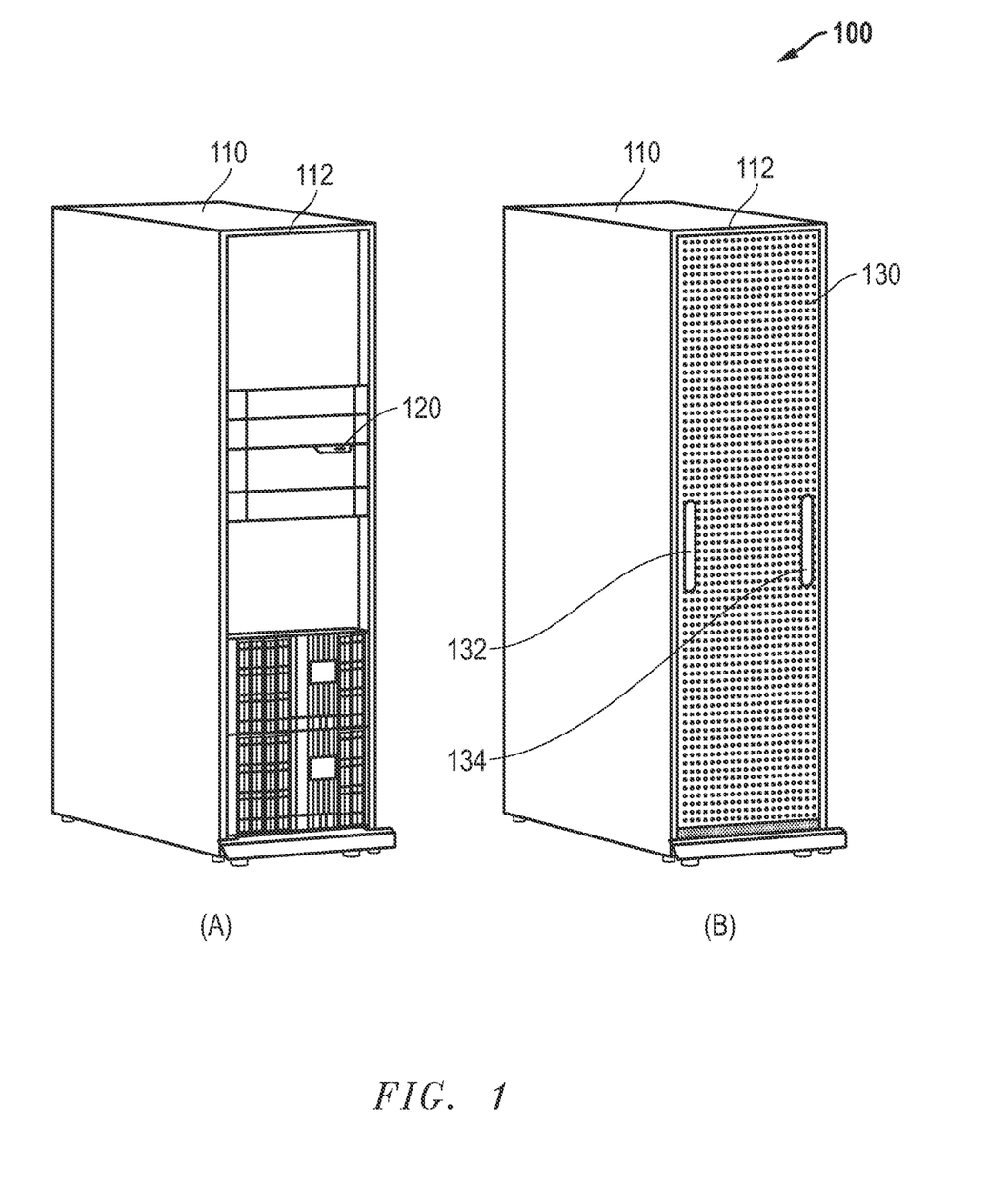
FIG. 1 is a perspective diagram of an information handling system according to a specific embodiment of the present disclosure.

FIG. 1 illustrates an information handling system 100 according to a specific embodiment of the present disclosure. System 100 is shown without a door/access panel installed (view A) and with a door/access panel installed (view B). For the purpose of example, system 100 is a server rack, such as a 24U, 42U, 48U, and the like. A server rack is configured to house rack-mounted components 120, such as servers, data storage devices, network communication devices, power supplies, and other devices. Information handling system 100 includes an enclosure 110, a trim component 112, and a removable access panel 130. Access panel 130 includes a handle 132 on the left side and a handle 134 on the right side. In particular, when the left handle 132 is actuated, access panel 130 can be opened on the left side, pivoting about a latch/hinge assembly on the right side. When the right handle 134 is actuated, access panel 130 can be opened on the right side, pivoting about a latch/hinge assembly on the left side. When both handles are actuated, access panel 130 can be fully removed form information handling system 100. The latch/hinge assemblies disclosed herein not only provide for either left or right opening, but also support improved manufacturing automation. For example, access panel 130 can be installed at chassis 110 without having to actuate handles 132 and 134.

Figure 2:
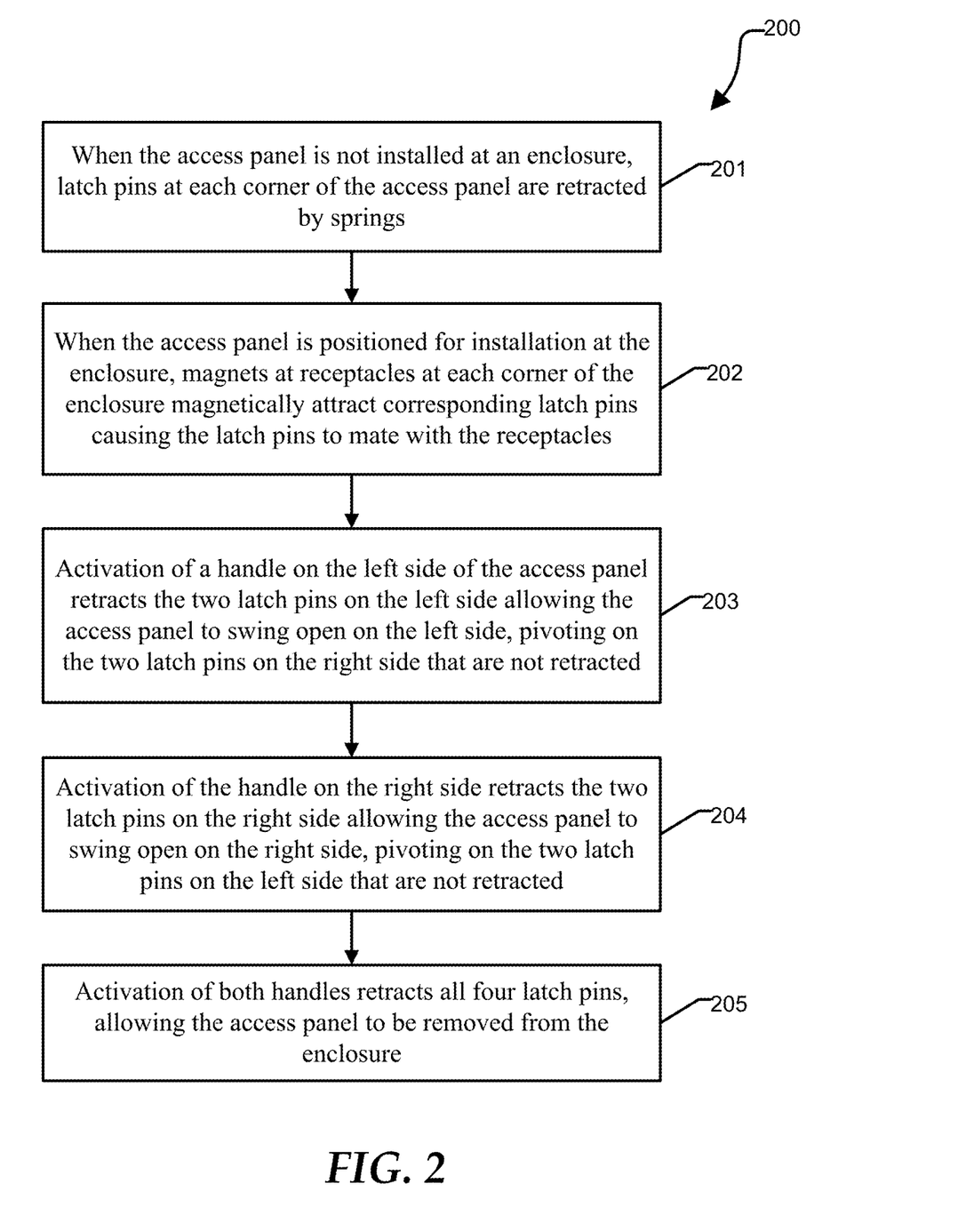
FIG. 2 is a flow diagram illustrating a method for operating an access panel and integrated latches according to a specific embodiment of the present disclosure.

FIG. 2 shows a method 200 for operating access panel 130 and integrated latches according to a specific embodiment of the present disclosure. Method 200 begins at block 201 where, when not installed at an enclosure, latch pins at each corner of the access panel are retracted by springs. Method 200 continues at block 202 where, when the access panel is positioned for installation at the enclosure, magnets at receptacles at each corner of the enclosure magnetically attract corresponding latch pins causing the latch pins to mate with the receptacles. The magnetic attraction of each latch pin overcomes the force of each spring that would otherwise maintain the latch pins in the retracted position. The receptacles may be included at enclosure 110 or at trim component 112. At block 203, activation of a handle on the left side of the access panel retracts the two latch pins on the left side allowing the access panel to swing open on the left side, while pivoting on the two latch pins on the right side that are not retracted. At block 204, activation of the handle on the right side retracts the two latch pins on the right side allowing the access panel to swing open on the right side, while pivoting on the two latch pins on the left side that are not retracted. Method 200 completes at block 205 where activation of both handles retracts all four latch pins, allowing the access panel to be removed from the enclosure. After the access panel is removed from enclosure, springs associated with each latch pin retract the corresponding latch pins. Operation of the latch/hinge assemblies may be better understood with reference to FIGS. 3-7.

Figure 3:
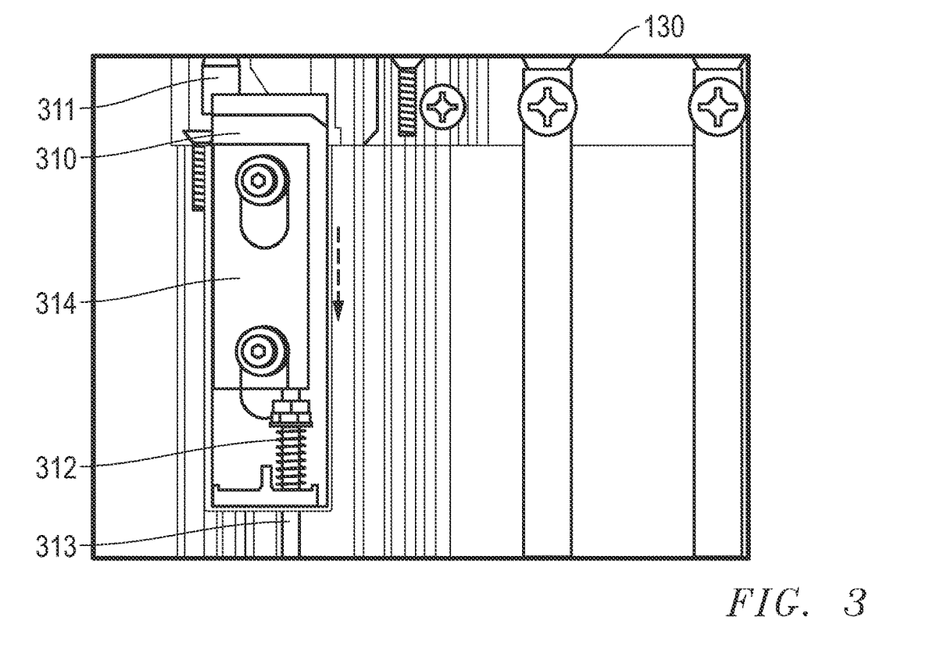
FIG. 3 is a mechanical diagram illustrating a latch mechanism according to a specific embodiment of the present disclosure.

FIG. 3 shows a latch mechanism according to a specific embodiment of the present disclosure. In particular, FIG. 3 shows the upper left corner of access panel 130 prior to installation at enclosure 110, including a shuttle 310 with an attached latch pin 311, a helical coil spring 312, and a pull rod 313. Latch pin 311 is fabricated from a magnetic material (a material that is attracted to a magnet), such as iron. Shuttle 310 is loosely coupled to access panel 130 by retainer 314, allowing shuttle 310 to translate up and down. Excursion of the shuttle is limited by slots included at shuttle 310 and by retainer 314. The latch mechanism shown at FIG. 3 can be replicated at each of the remaining corners of access panel 130. Spring 312 is configured to provide both compression and tension/extension force. As illustrated at FIG. 3, spring 312 is presently in an intermediate state, neither fully extended nor fully compressed, having positioned shuttle 310 and latch pin 311 in a retracted position. In particular, while in the intermediate state, spring 312 can provide a small pre-loading force to keep the top left and right corner shuttles 310 from potentially rattling due to any induced external vibrations while latch pin 311 is in the retracted position.

Springs 312 at latch mechanisms provided at the lower left and lower right corners of access panel 130 should provide enough pre-loading force to overcome the weight of each shuttle 310. For example, if spring 312 is not strong enough, the lower left and right corner shuttles 310 will not remain retracted allowing the latch pin 311 to remain protruding from the access panel 130. In an embodiment, magnets 302 utilized in the top left and top right corner receptacles 301 can provide greater magnetic attractive force compared the bottom left and bottom right corner receptacles 301 if the same size of spring 312 is used on both the upper and lower shuttles 310. This is due to the top magnets 302 needing to overcome the additional weight of the top left and right corner shuttles 310 to deploy the upper latch pins 311. Alternatively, differently sized springs 312 can be used for the upper left and upper right latches relative to those used at latches in the lower left and lower right corners. In particular, springs 312 included at the upper latches can provide only enough pre-load force to avoid potential rattling of the upper shuttles 310, and the lower left and lower right springs 312 can provide enough force to overcome the weight of shuttles 310 at the bottom left and bottom right corner. In this case, the size/number of magnets 302 used in the top left and right corner receptacles 301 may be the same as the size/number of magnets 302 used in the bottom left and right corner receptacles 301.

Figure 4:
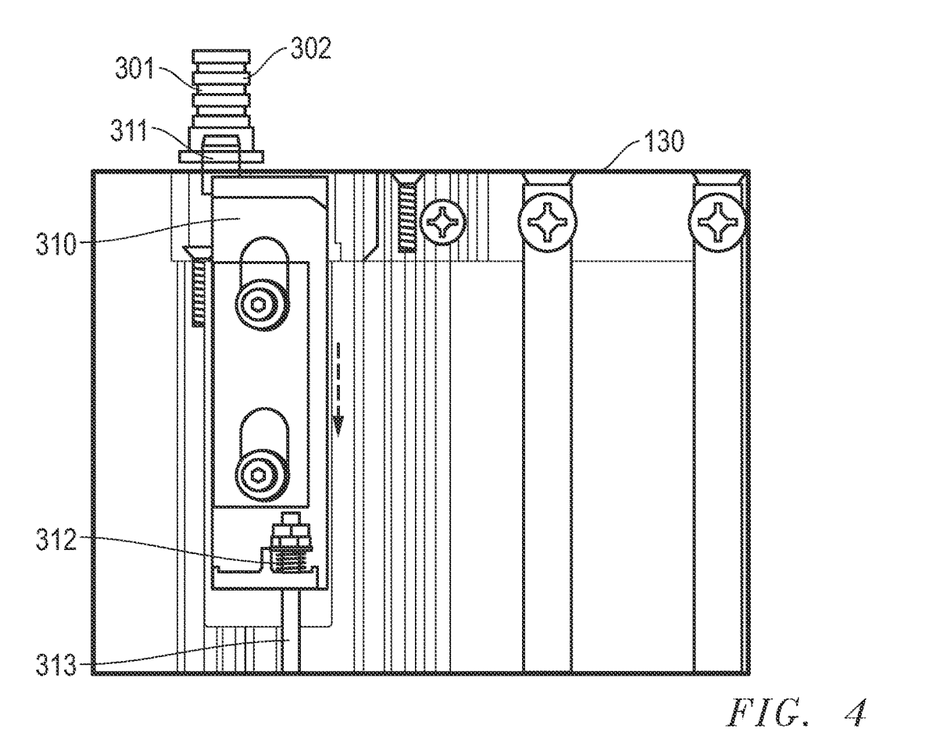
FIG. 4 is a mechanical diagram illustrating the latch mechanism of FIG. 3 according to another embodiment of the present disclosure.

FIG. 4 shows the latch mechanism of FIG. 3 according to another embodiment of the present disclosure. FIG. 4 shows the components of FIG. 3 and in addition, shows receptacle 301 located at the upper left corner of enclosure 110 or trim component 112. A magnet 302 is installed at the root/base of receptacle 301. When access panel 130 is positioned for installation at enclosure 110, magnet 302 attracts latch pin 311, causing shuttle 310 to translate to an upper position where latch pin 311 mates with receptacle 301. Spring 312 is now in a compressed state, with force provided by spring 312 unsuccessfully attempting to return spring 312 to the intermediate state due to attraction by magnet 302 on latch pin 311. In this position, latch pin 311 secures the top left corner of access panel 130 at enclosure 110. Latch pin 311 and receptacle 301 may also act as a hinge, allowing access panel 130 to pivot about latch pin 311.

Figure 5:
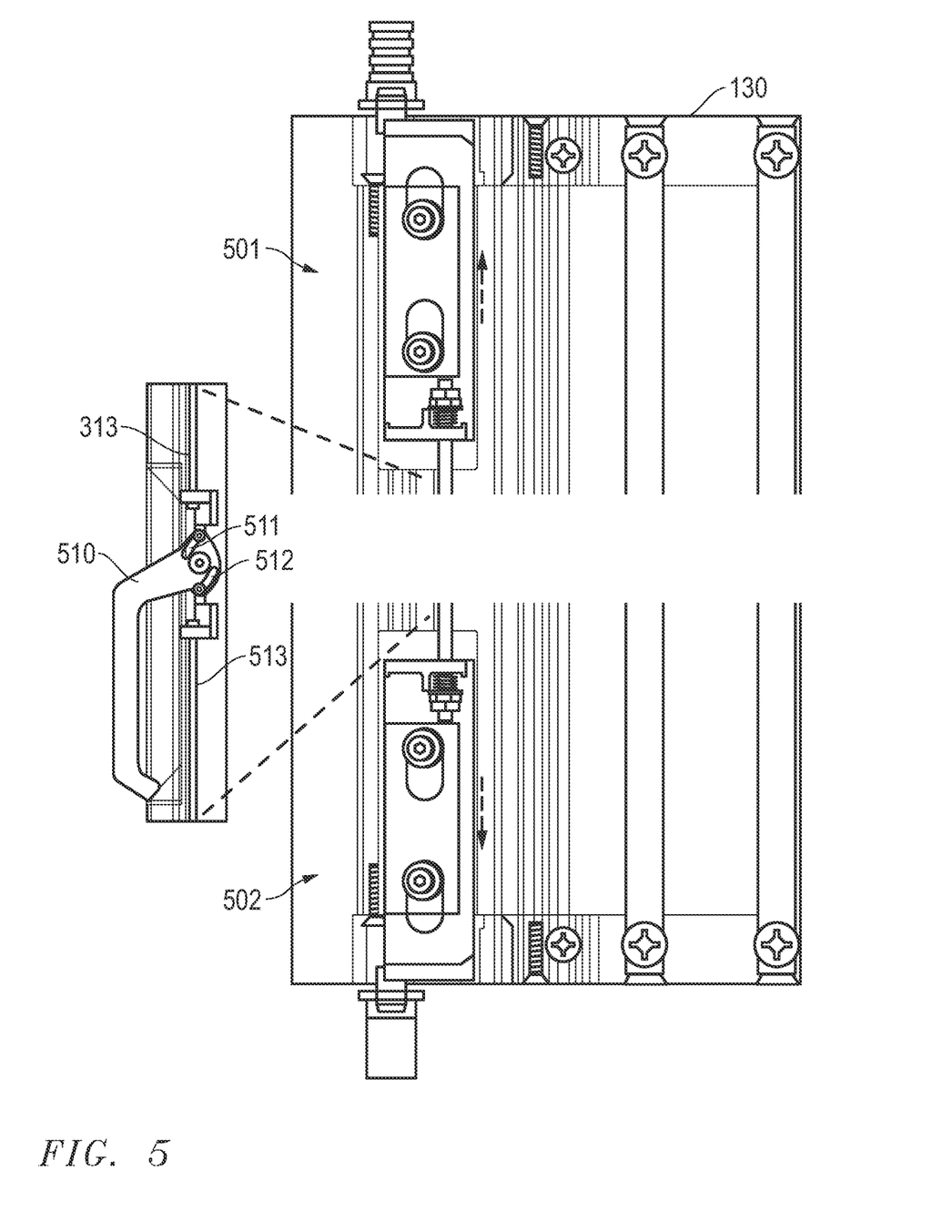
FIG. 5 is a mechanical diagram illustrating two latch mechanisms and a corresponding handle at an access panel according to a specific embodiment of the present disclosure.

FIG. 5 shows two latch mechanisms and a corresponding handle according to a specific embodiment of the present disclosure. In particular FIG. 5 shows the state of access panel 130 when installed at enclosure 110, including a latch mechanism 501 at the upper left corner of access panel 130, and a latch mechanism 502 located at the lower left corner of access panel 130. FIG. 5 also shows a handle 510 that can be actuated to retract latch pins at latch mechanisms 501 and 502. Handle 510 includes a cam slot 511 loosely coupled to pull rod 313 of mechanism 501, and another cam slot 512 loosely coupled to a pull rod 513 that is coupled to mechanism 502. As shown, handle 510 is in an un-actuated position where magnets at each of the top left and bottom left receptacles have attracted the corresponding latch pins to mate with the receptacles. Spring 312, at each of mechanisms 501 and 502, are in a compressed state, unable to overcome the magnetic force of magnets 302.

Figure 6:
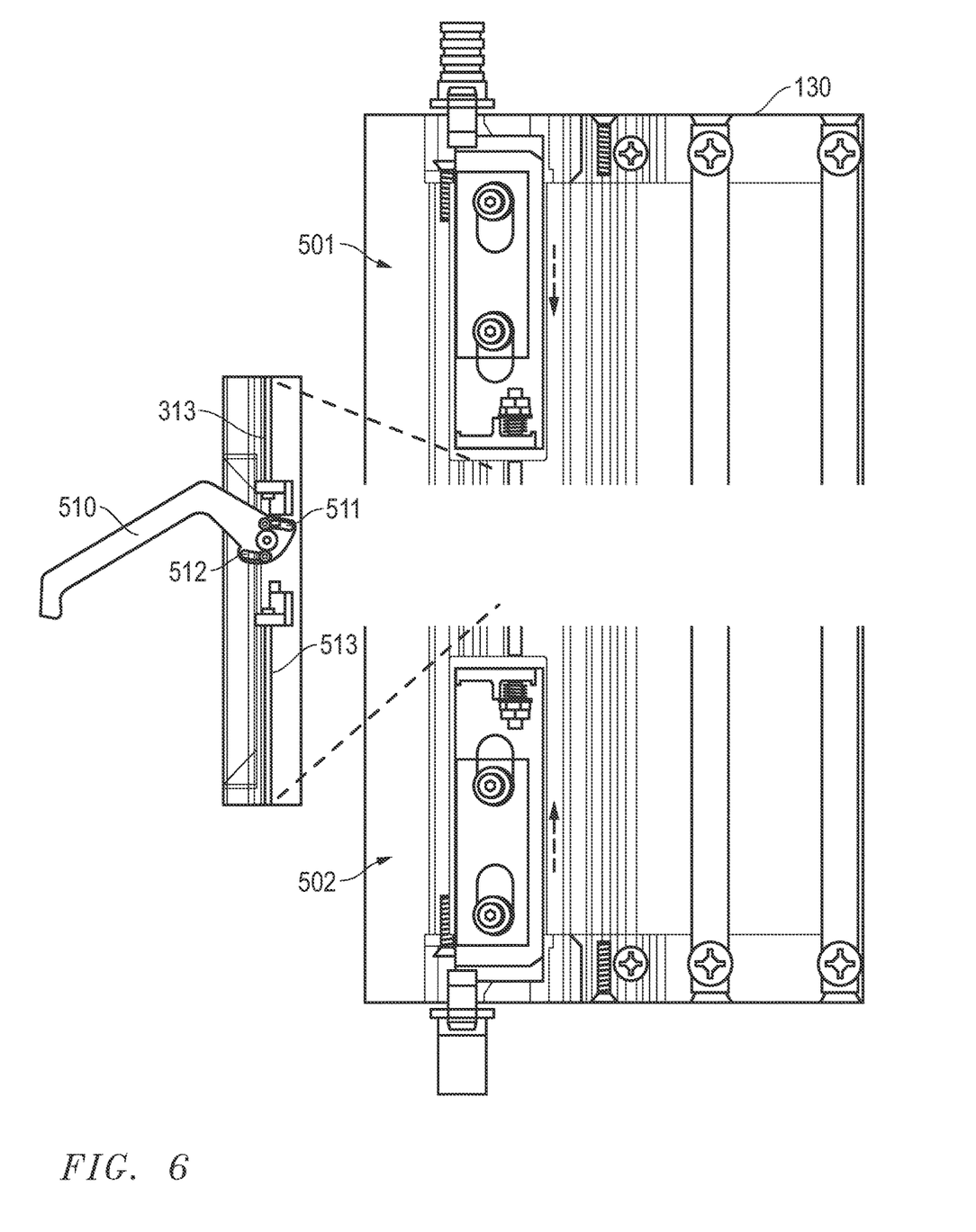
FIG. 6 is a mechanical diagram illustrating the latch mechanisms of FIG. 5 where the handle is actuated to open the access panel according to a specific embodiment of the present disclosure.

FIG. 6 shows the latch mechanisms of FIG. 5 where handle 510 is actuated to open access panel 130 according to a specific embodiment of the present disclosure. FIG. 5 is similar to FIG. 4, showing the left side of access panel 130, but with handle 510 in an actuated position to retract latch pins 311 at each of mechanisms 501 and 502. When handle 510 is move to the actuated position, as shown, pull rods 313 coupled to latch mechanism 501 is pulled down, spring 312 at mechanism 501 is compressed, and followed by retracting latch pin 311 at mechanism 501. Similarly, actuation of handle 510 moves pull rod 513 in an upward direction, compressing spring 312 at mechanism 502, and retracting latch pin 311 at mechanism 502. With latch pins 311 retracted, access panel 130 may open on the left side, pivoting on latch pins 311 that remain un-retracted on the right side. In addition, compression of springs 312, in addition to the force of gravity acting on handle 510, and can provide tension to attempt to return handle 510 to the un-actuated position when a user releases handle 510.

Figure 7:
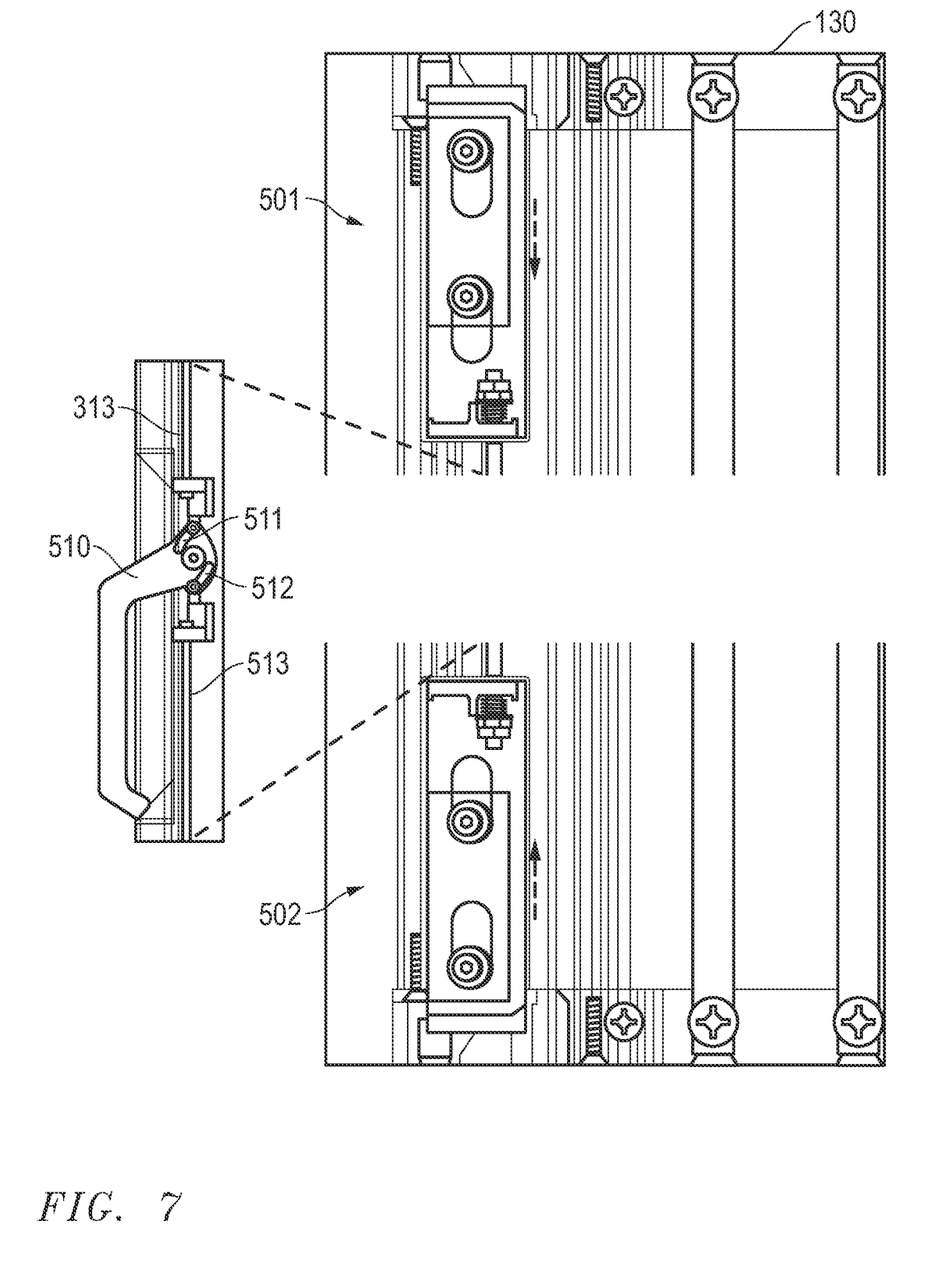
FIG. 7 is a mechanical diagram illustrating the latch mechanisms of FIG. 5 when the access panel is open or removed from the information handling system enclosure, according to a specific embodiment of the present disclosure.

FIG. 7 shows the latch mechanisms of FIG. 5 when access panel 130 is open on the left side or is removed from enclosure 110, according to a specific embodiment of the present disclosure. In particular, without the magnetic attraction on latch pins 311 provided by magnets 302, latch pins 311 remain retracted at latch mechanisms 501 and 502 despite having handle 510 in the un-actuated position.

Figure 8:
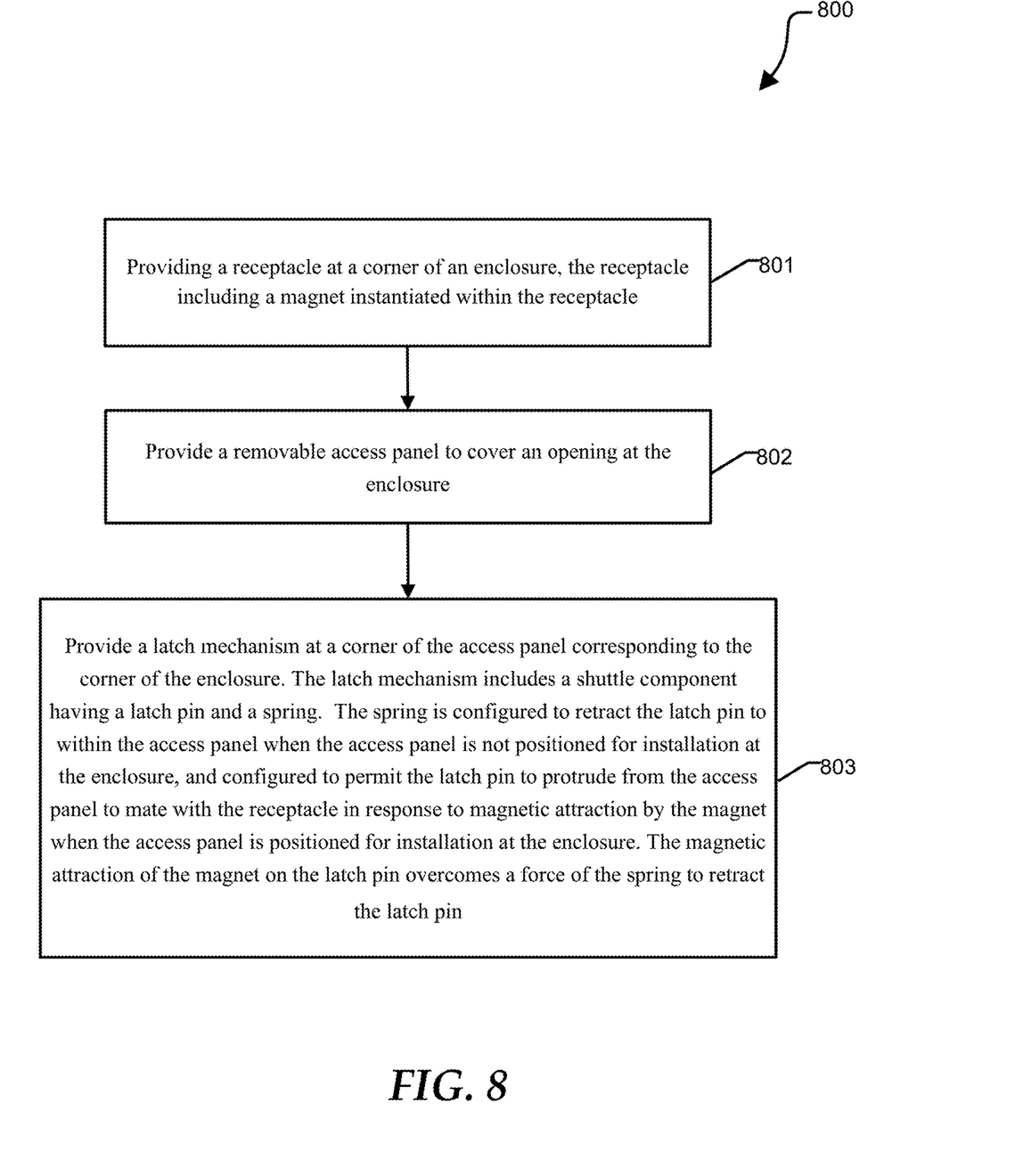
FIG. 8 is a flow diagram illustrating a method for implementing a latch/hinge mechanism according to an embodiment of the present disclosure.

FIG. 8 shows a method 800 for implementing a latch/hinge mechanism according to an embodiment of the present disclosure. Method 800 begins at block 801 where a receptacle is provided at a corner of an enclosure, the receptacle including a magnet instantiated within the receptacle. For example, FIG. 4 shows receptacle 301 and magnet 302. In an embodiment, receptacle 301 is a cylindrical shaped opening at trim component 112 or enclosure 110. As described above, a receptacle can be provided at each of the four corners of information handling system 100. Method 700 continues at block 802 where a removable access panel, such as panel 130, is provided to cover an opening at the enclosure.

Method 800 completes at block 803 where a latch mechanism is provided at a corner of the access panel corresponding to the corner of the enclosure having the receptacle. The latch mechanism includes a shuttle component having a latch pin and a spring. In an embodiment, latch pin 311 is cylindrical shaped having a diameter slightly less than a diameter of receptacle 301. The spring is configured to retract the latch pin to within the access panel when the access panel is not positioned for installation at the enclosure, and configured to permit the latch pin to protrude from the access panel to mate with the receptacle in response to magnetic attraction by the magnet when the access panel is positioned for installation at the enclosure. The magnetic attraction of the magnet on the latch pin overcomes a force of the spring attempting to retract the latch pin. In a typical implementation, access panel 130 includes a latch mechanism in each of the four corners of the panel so that the latch pin at each mechanism is aligned with a corresponding receptacle.

While the disclosed latch/hinge mechanism has been described in the context of an information handling system server rack and associated access panel, one of skill will appreciate that the mechanism may be utilized in other applications. For example, the disclosed latch/hinge mechanism can be used to attach a display and/or cover to a laptop computer. For another example, the latch/hinge mechanism may be utilized to secure a door to a cabinet, appliance, and the like, so as to allow the door to open from the right side, the left, or to be removed entirely.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, a programmable logic array (PLA), an embedded device such as a System-on-a-Chip (SoC), or other control logic hardware. Information handling system 100 can also include one or more computer-readable medium for storing machine-executable code, such as software or data.

Information handling system 100 can include a set of instructions that can be executed to cause the information handling system to perform any one or more of the methods or computer based functions. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
an enclosure including a first receptacle located at a first corner of the enclosure, the first receptacle to receive a first latch pin, the first receptacle including a first magnet positioned at a base of the first receptacle; and
a removable access panel including a first latch mechanism proximate to a first corner of the access panel, the first latch mechanism including:
a first shuttle component including the first latch pin;
a first handle;
a first spring to:
retract the latch pin to within the access panel when the access panel is not positioned for installation at the enclosure;
permit the first latch pin to protrude from the access panel and mate with the first receptacle in response to magnetic attraction of the first latch pin by the first magnet when the access panel is positioned for installation at the enclosure, magnetic attraction of the first magnet to the first latch pin overcoming a force of the first spring to retract the first latch pin;
assume an intermediate state when the first latch pin is retracted from the first receptacle;
assume a compressed state when the first latch pin is mated to the first receptacle, the force provided by the first spring attempting to return the first spring to the intermediate state; and
assume a compressed state when the first handle is actuated, the force provided by the first spring to attempt to return the first spring to the intermediate state and to attempt to return the first handle to an unactuated position; and
a first pull rod, one end of the first pull rod coupled to the first shuttle via the first spring, a second end of the first pull rod coupled to the first handle via a first cam opening in the first handle,
wherein when the first handle is actuated, the first handle is configured to pull on the first pull rod and cause the first pull rod to compress the spring and to retract the first latch pin from within the access panel.

2. The information handling system of claim 1, wherein the enclosure includes a second receptacle located at a second corner of the enclosure, the second receptacle vertically aligned with the first receptacle and including a second magnet positioned at a base of the second receptacle.

3. The information handling system of claim 2, wherein the removable access panel includes a second latch mechanism proximate to a second corner of the access panel, the second latch mechanism vertically aligned with the first latch mechanism, the second latch mechanism including:
a second shuttle component including a second latch pin; and
a second spring to retract the second latch pin to within the access panel when the access panel is not positioned for installation at the enclosure, and configured to permit the second latch pin to protrude from the access panel to mate with the second receptacle in response to magnetic attraction of the second latch pin by the second magnet when the access panel is positioned for installation at the enclosure, magnetic attraction of the second magnet on the second latch pin overcoming force of the second spring to retract the second latch pin.

4. The information handling system of claim 3, further comprising:
a second pull rod, one end of the second pull rod coupled to the second shuttle via the second spring, a second end of the second pull rod coupled to the first handle via a second cam opening in the first handle,
wherein the first handle is configured to retract the second latch pin when the first handle is actuated.

5. The information handling system of claim 4, wherein the first latch pin and the second latch pin when extended into the corresponding first and second receptacles provide a hinge to allow the access panel to pivot about the first and second latch pins.

6. The information handling system of claim 1, wherein the enclosure further includes a trim component surrounding an opening at the enclosure, the first receptacle included at the trim component.

7. The information handling system of claim 1, wherein the first shuttle is configured to translate from a first position where the first latch pin is retracted from the first receptacle to a second position where the latch pin is extended into the first receptacle.

8. A method comprising:
providing a first receptacle at a first corner of an enclosure, the first receptacle including a first magnet instantiated within the first receptacle;
providing a removable access panel to cover an opening at the enclosure; and
providing a first latch mechanism at a first corner of the access panel corresponding to the first corner of the enclosure, wherein a first handle is coupled to the first latch mechanism, the first latch mechanism including:
a first shuttle component including a first latch pin; and
a first spring to retract the first latch pin within the access panel when the access panel is not positioned for installation at the enclosure, and configured to permit the first latch pin to protrude from the access panel to mate with the first receptacle in response to magnetic attraction by the first magnet when the access panel is positioned for installation at the enclosure, magnetic attraction of the first magnet on the first latch pin overcoming the first spring to retract the first latch pin;
entering, by the first spring, an intermediate state when the first latch pin is retracted from the first receptacle;
entering, by the first spring, a compressed state when the first latch pin is mated to the first receptacle, the force provided by the first spring attempting to return the first spring to the intermediate state;
entering, by the first spring, a compressed state when the first handle is actuated, the force provided by the first spring to attempt to return the first spring to the intermediate state and to attempt to return the first handle to an actuated position; and
providing a first pull rod, one end of the first pull rod coupled to the first shuttle via the first spring, a second end of the first pull rod coupled to the first handle via a first cam opening in the first handle,
wherein when the first handle is actuated, the first handle is configured to pull on the first pull rod and cause the first pull rod to compress the spring and to retract the first latch pin from within the access panel.

9. The method of claim 8, further comprising:
providing a second receptacle at a second corner of an enclosure, the second receptacle vertically aligned with the first receptacle and including a second magnet instantiated within the second receptacle; and
providing a second latch mechanism at a second corner of the access panel corresponding to the second corner of the enclosure, the second latch mechanism including:
a second shuttle component including a second latch pin; and
a second spring to retract the second latch pin to within the access panel when the access panel is not positioned for installation at the enclosure, and configured to permit the second latch pin to protrude from the access panel to mate with the second receptacle in response to magnetic attraction by the second magnet when the access panel is positioned for installation at the enclosure, magnetic attraction of the second magnet on the second latch pin overcoming the second spring to retract the second latch pin.

10. The method of claim 9, further comprising:
providing a second pull rod, one end of the second pull rod coupled to the second shuttle via the second spring, a second end of the second pull rod coupled to the first handle via a second cam opening in the first handle,
wherein the first handle is configured to retract the second latch pin when actuated.

11. The method of claim 10, wherein the first latch pin and the second latch pin, when extended into the corresponding first and second receptacles, provide a hinge to allow the access panel to pivot about the first and second latch pins.

12. The method of claim 8, wherein the enclosure further includes a trim component surrounding an opening at the enclosure, the first receptacle included at the trim component.

13. The method of claim 8, wherein the first shuttle is configured to translate from a first position where the first latch pin is retracted from the first receptacle to a second position where the latch pin is extended into the first receptacle.

14. A latch to secure an access panel at an enclosure, the latch comprising:

a shuttle component including a latch pin, the latch pin configured to mate with a corresponding receptacle at the enclosure;

a handle; and a spring to:
- retract the latch pin to within the access panel when the access panel is not positioned for installation at the enclosure;
- permit the latch pin to protrude from the access panel to mate with the receptacle in response to attraction by a magnet positioned within the receptacle when the access panel is positioned for installation at the enclosure, the attraction of the magnet to the latch pin overcoming the spring to retract the latch pin;
- assume an intermediate state when the latch pin is retracted from the receptacle;
- assume a compressed state when the latch pin is mated to the receptacle, the force provided by the spring attempting to return the spring to the intermediate state; and
- assume a compressed state when the handle is actuated, the force provided by the spring to attempt to return the spring to the intermediate state and to attempt to return the handle to an unactuated position; and a pull rod, one end of the pull rod coupled to the shuttle via the spring, a second end of the pull rod coupled to the handle via a cam opening in the handle, wherein when the handle is actuated, the handle is configured to pull on the pull rod and cause the pull rod to compress the spring and to retract the latch pin from within the access panel.

15. The latch of claim 14, wherein:

a first instantiation of the latch is provided at a first corner of the access panel;

a second instantiation of the latch is provided at a second corner of the access panel;

a third instantiation of the latch is provided at a third corner of the access panel; and a fourth instantiation of the latch is provided at a fourth corner of the access panel, wherein each instantiation of the latch includes a corresponding latch pin to mate with a corresponding receptacle at each of four corners of the enclosure.

\* \* \* \* \*

UNITED STATES PATENT AND TRADEMARK OFFICE
CERTIFICATE OF CORRECTION

PATENT NO. : 11,570,926 B2
APPLICATION NO. : 17/097525
DATED : January 31, 2023
INVENTOR(S) : Richard A. Crisp et al.

It is certified that error appears in the above-identified patent and that said Letters Patent is hereby corrected as shown below:

In the Claims

Column 8, Line 17: Please change "actuated" to --unactuated--

Signed and Sealed this
Third Day of October, 2023

Katherine Kelly Vidal
*Director of the United States Patent and Trademark Office*